United States Patent
Kim et al.

(10) Patent No.: US 7,796,438 B2
(45) Date of Patent: Sep. 14, 2010

(54) FLASH MEMORY DEVICE AND METHOD OF PROGRAMMING THE SAME

(75) Inventors: Ju In Kim, Incheon-si (KR); Ju Yeab Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 391 days.

(21) Appl. No.: 11/951,315

(22) Filed: Dec. 5, 2007

(65) Prior Publication Data
US 2009/0052240 A1 Feb. 26, 2009

(30) Foreign Application Priority Data
Jul. 25, 2007 (KR) ................ 10-2007-0074489

(51) Int. Cl.
*G11C 16/06* (2006.01)
(52) U.S. Cl. .............. 365/185.22; 365/185.17; 365/189.05
(58) Field of Classification Search ......... 365/185.22, 365/185.17, 189.05
See application file for complete search history.

(56) References Cited

U.S. PATENT DOCUMENTS

| | | | |
|---|---|---|---|
| 7,200,044 B2* | 4/2007 | Won et al. ............. | 365/185.22 |
| 7,336,538 B2* | 2/2008 | Crippa et al. .......... | 365/185.12 |
| 7,457,158 B2* | 11/2008 | Lee et al. .............. | 365/185.03 |
| 7,532,524 B2* | 5/2009 | Hartono et al. ........ | 365/195 |
| 7,551,487 B2* | 6/2009 | Park et al. ............. | 365/185.22 |
| 7,583,540 B2* | 9/2009 | Park et al. ............. | 365/185.33 |
| 7,609,548 B2* | 10/2009 | Park ..................... | 365/185.03 |

FOREIGN PATENT DOCUMENTS

| | | |
|---|---|---|
| JP | 09-251787 | 9/1997 |
| JP | 11-288597 | 10/1999 |

* cited by examiner

*Primary Examiner*—Tuan T. Nguyen
(74) *Attorney, Agent, or Firm*—Marshall, Gerstein & Borun LLP

(57) ABSTRACT

A flash memory device may include a memory cell array, a page buffer unit, and a switching element. The page buffer unit may include first and second latches and is configured to program data into the memory cell array and read data from the memory cell array. The switching element enables the first latch during a verify operation of a first program based on a first verify voltage, and enables or disables the first latch in order to execute a verify operation of a second program based on a second verify voltage lower than the first verify voltage depending on whether data to be programmed has been stored in the second latch.

20 Claims, 7 Drawing Sheets

PRIOR ART

FLASH MEMORY DEVICE AND METHOD OF PROGRAMMING THE SAME

CROSS-REFERENCES TO RELATED APPLICATIONS

This patent claims priority to Korean patent application number 10-2007-74489, filed on Jul. 25, 2007, the disclosure of which is incorporated by reference in its entirety.

TECHNICAL FIELD

This patent relates to flash memory devices and, more particularly, to a flash memory device capable of reducing a change width of the threshold voltage due to an interference phenomenon and a program method thereof.

BACKGROUND OF THE INVENTION

A well-known NAND flash memory device includes a memory cell array, a row decoder, and a page buffer. The memory cell array includes a plurality of word lines extending along rows, a plurality of bit lines extending along columns, and a plurality of cell strings respectively corresponding to the bit lines.

A string select line, the word lines, and the row decoder connected to a common source line are disposed on one side of the memory cell array, and the page buffer connected to the plurality of bit lines is disposed on the other side of the memory cell array.

As multi-level cells (MLCs) having a cell voltage distribution width of a multi-level are developed, a method of reducing the width of cell threshold voltage distributions may become a problem.

A conventional program method employs an Incremental Step Pulse Programming (ISPP) method of reprogramming a cell, which does not exceed a verify voltage level at a specific voltage level, by raising the voltage of the cell as high as a specific step and may present additional problems.

FIG. 1A illustrates a conventional ISPP voltage supply level. As shown in FIG. 1A, a program may perform at an initial program start voltage V1, and a program verification is then performed at a verify voltage PV. The program may perform again on cells that have not been verified by increasing the program voltage as high as a predetermined voltage step Vs or by raising voltage as high as the voltage step Vs. If the cells are not verified even after the program is performed up to a maximum program voltage Vn in this program process, program fails.

Meanwhile, a memory device having a multi-level cell may be configured to store plural pieces of bit data in one memory cell. As the number of bits for storage increases, the width of cell threshold voltage distributions reduces.

In a program process of a NAND flash memory device, the threshold voltage of a cell into which data is already programmed is read to have a higher value due to capacitance between cells in a process where adjacent cells are programmed. This is called an interference phenomenon.

A degree in which cell threshold voltage distributions are changed by the interference phenomenon is great as a change of the threshold voltage of peripheral cells or adjacent cells is increased. In order to reduce the degree in which the threshold voltage of adjacent cells is changed, a soft program on-chip method of programming an erased cell at a low voltage with the threshold voltage of the erased cell being erased in order for the threshold voltage of the cell to have a negative value, but an absolute value thereof to be low, and so on are used.

FIG. 1B illustrates a change of threshold voltage distributions depending on a soft program of erased cells. As shown, threshold voltage distributions of an erased cell 101 may be changed to have a low absolute value 102 while maintaining a negative value through a soft program. The soft program operation may be performed on the entire cells using the same program voltage, wherein a verify voltage is set to 0V. When program pass occurs even in 1 bit, the soft program operation is completed. If the above soft program is performed, an erased cell has threshold voltage distributions of about −1V. The threshold voltage distributions of the erased cell may reduce the threshold voltage change phenomenon due to the interference phenomenon up cell program.

However, although the soft program method is employed, the threshold voltage of a cell may not be prevented from being changed depending on a program operation of adjacent cells with the threshold voltage of the cell is first programmed.

BRIEF SUMMARY OF THE INVENTION

This patent is directed to a flash memory device flexibly employing a program verify voltage depending on whether program is performed on adjacent cells when the flash memory device is programmed, and a program method thereof.

In an embodiment of the invention, a flash memory device may include a memory cell array, a page buffer unit, and a switching element. The page buffer unit may include first and second latches and is configured to program data into the memory cell array and read data from the memory cell array. The switching element may enable the first latch during a verify operation of a first program based on a first verify voltage, and may either enable or disable the first latch in order to execute a verify operation of a second program based on a second verify voltage lower than the first verify voltage depending on whether data to be programmed has been stored in the second latch.

BRIEF DESCRIPTION OF THE DRAWINGS

For a more complete understanding of the disclosure, reference should be made to the following detailed description and accompanying drawings wherein.

DETAILED DESCRIPTION

Figure 1A:
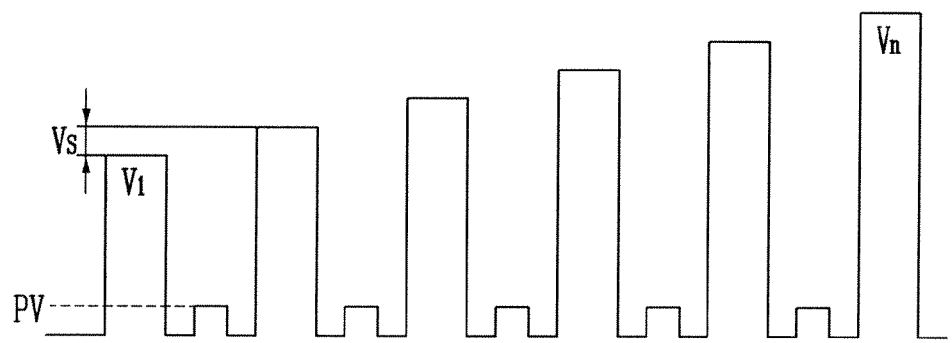
FIG. 1A illustrates a conventional ISPP voltage supply level.
Figure 1B:
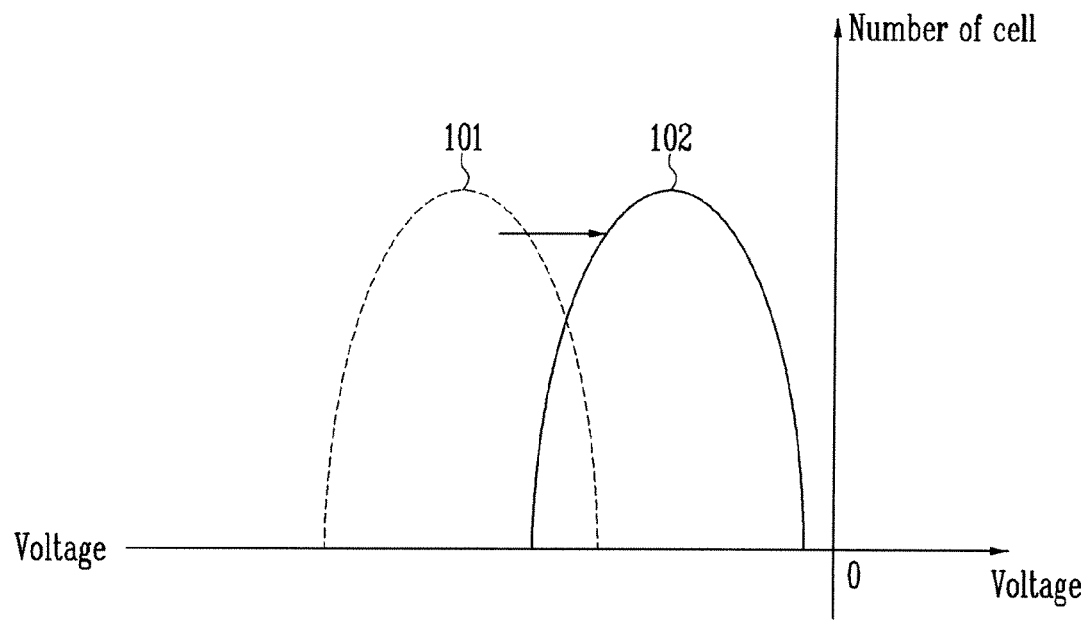
FIG. 1B illustrates a change of threshold voltage distributions depending on a soft program of erased cells.
Figure 2A:
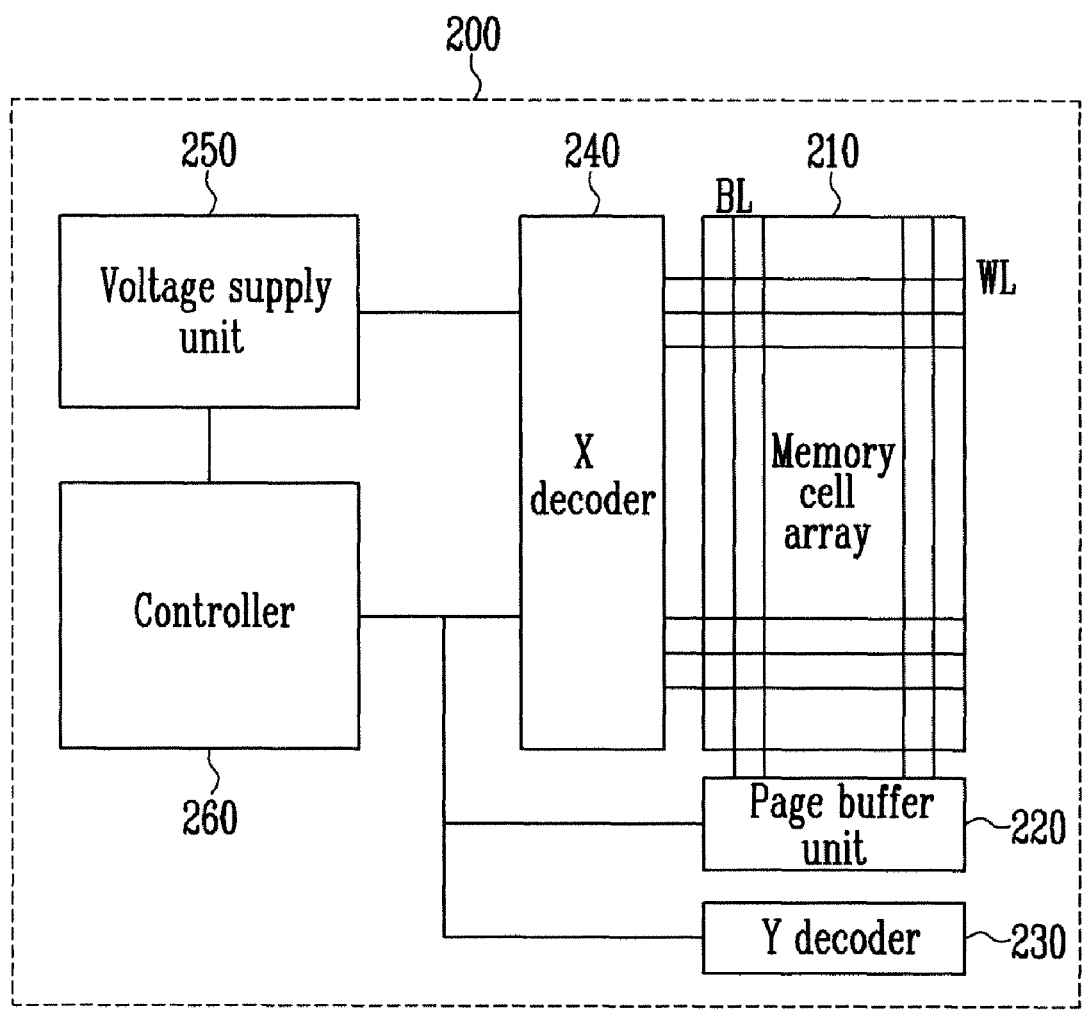
FIG. 2A is a block diagram illustrating a construction of a NAND flash memory device.
Figure 2B:
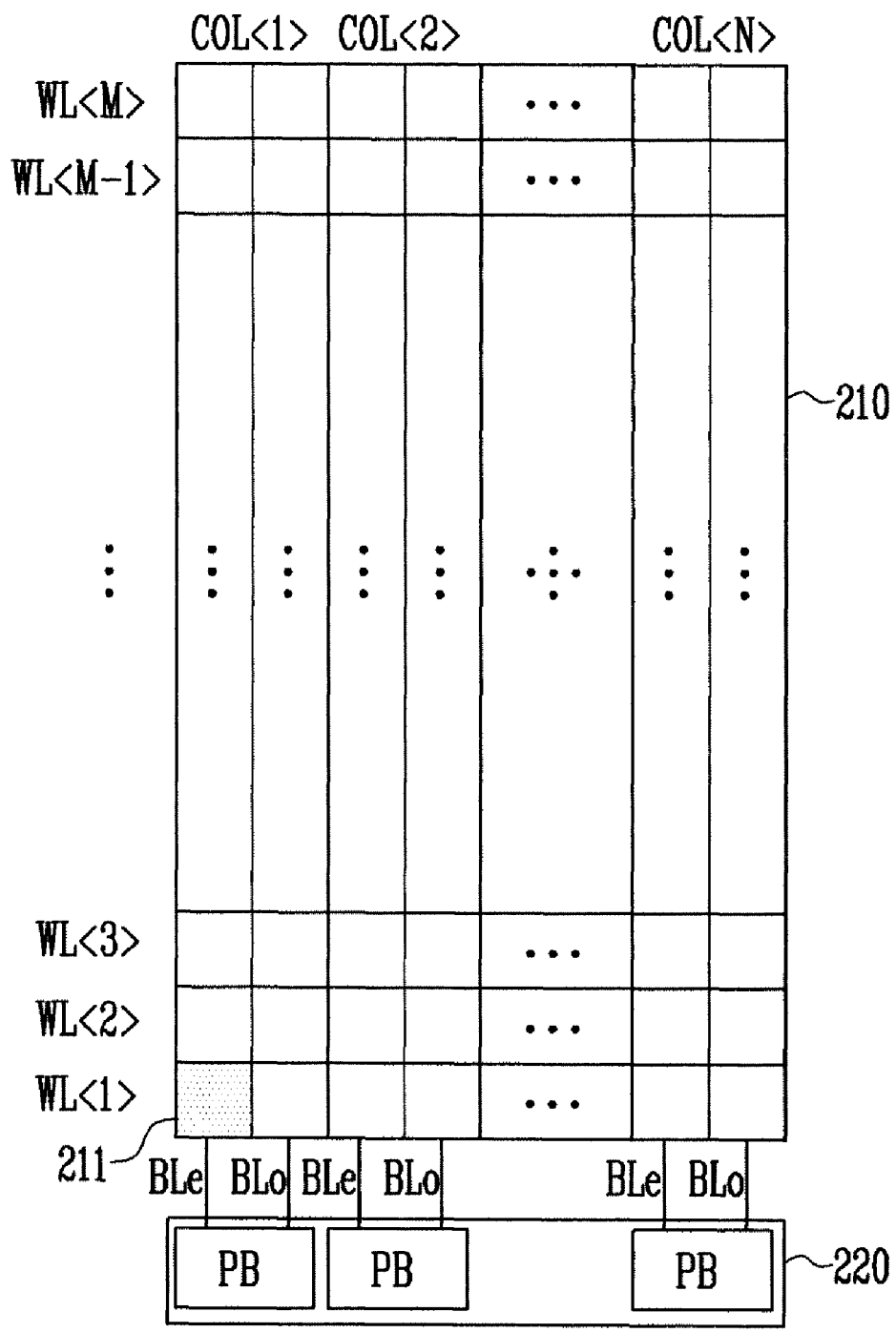
FIG. 2B is a block diagram illustrating a connection configuration of a memory array and page buffers shown in FIG. 2A.

Referring to FIG. 2A, a NAND flash memory device 200 according to an embodiment of the present invention includes a memory cell array 210, a page buffer unit 220, a Y decoder 230, a X decoder 240, a voltage supply unit 250, and a controller 260. The memory cell array 210 may include a plurality of memory cells 211 (as shown in FIG. 2B) capable of storing data. The memory cells 211 may be arranged by bit lines BL and word line WL.

The page buffer unit 220 may include a plurality of page buffer circuits PB (refer to FIG. 2B). The page buffer circuits PB of the page buffer unit 220 may be connected to bit line pairs BL of the memory cell array 210, respectively, and perform an operation for programming data into the memory cell array 210 of bit lines BL or reading data stored in the memory cell array 210 of bit lines BL. Further, the page buffer circuits PB of the page buffer unit 220 may stores data to be programmed into the memory cell that will be connected next, depending on whether a cell to be programmed next has been programmed, and then perform program verification using a first verify voltage PV or a second verify voltage PV_INT (refer to FIG. 3A).

The Y decoder 230 may provide a data input/output (I/O) path to the plurality of page buffer circuits PB of the page buffer unit 220 in response to the control signal. The X decoder 240 may select word lines WL of the memory cell array 210 according to an input address. The voltage supply unit 250 may generate and provide voltages necessary for an operation of the flash memory device 200. The controller 260 may output the control signal to control the operation of the flash memory device 200.

FIG. 2B is a detailed block diagram illustrating a connection configuration of a memory cell array 210 and the page buffer circuit PB of the page buffer unit 220. The memory cell array 210 may include first to N column lines COL<1> to COL<N> arranged in a longitudinal direction and first to M word lines WL<0> to WL<M> arranged in a transverse direction. Each first to N column lines COL<1> to COL<N> may include of a pair of bit lines BLe, BLo including an even line and an odd line. Memory cells 211 of the memory cell array 210 may be selected by the word lines WL and the bit lines BL.

The pair of bit lines BLe, BLo of COL<1> may be connected to one page buffer circuit PB of the page buffer unit 220. Program may be performed on the entire column lines of an even bit of one word line and then performed on the entire column lines of an odd bit line of the same word line. For instance, after the first word line WL<1> is selected, the even bit lines BLe of the first to N column lines COL<1> to COL<N> are programmed and the odd bit lines BLo of the first to N column lines COL<1> to COL<N> of the first word line WL<1> are then programmed. Thereafter, the program shifts to the second word line WL<2> and is then performed in a similar order of the same column and bit lines. More details about a construction of the page buffer circuit PB will follow.

Figure 2C:
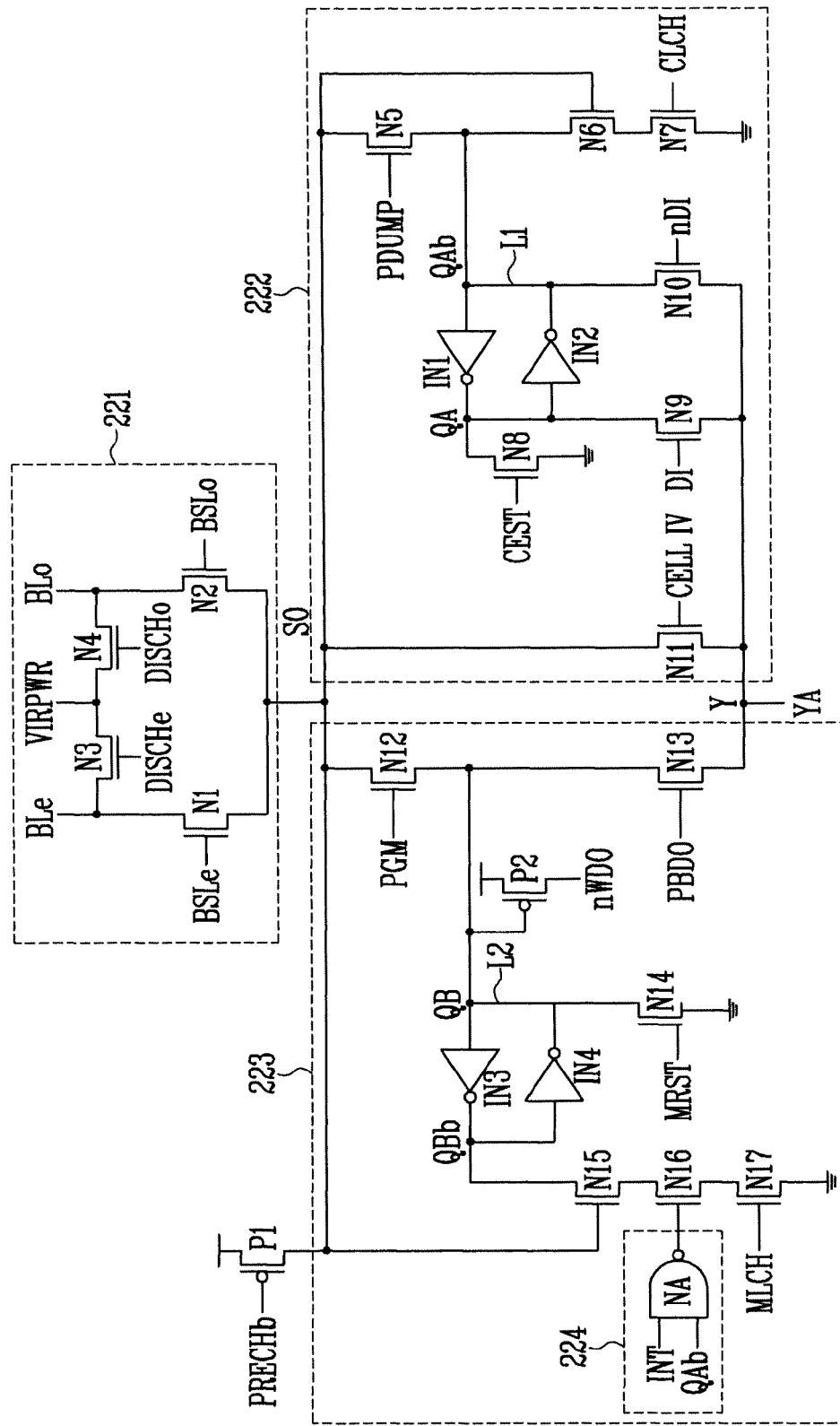
FIG. 2C is a detailed circuit diagram of the page buffer circuit shown in FIG. 2B.

Referring to FIG. 2C, the page buffer circuit PB may include a bit line select unit 221, a first latch unit 222, and a second latch unit 223. The bit line select unit 221 for selecting one of the pair of bit lines BLe, BLo may include first to fourth NMOS transistors N1 to N4. The first and second NMOS transistors N1, N2 may perform a switching operation for connecting the even bit line BLe and the odd bit line BLo, respectively, to a sensing node SO. The third and fourth NMOS transistors N3, N4 of the bit line select unit may function to discharge voltage precharged in the bit lines.

A first PMOS transistor P1 for precharging the sensing node SO is connected to the page buffer circuit PB. The first data may include not only data of one bit input to one page buffer circuit PB, but also data to be programmed first, which is latched in the entire page buffer circuits PB. The second data may include data to be programmed next, which is latched in the entire page buffer circuits PB.

As mentioned simply earlier when describing the page buffer unit 220 with reference to FIG. 2A, the page buffer circuit PB can perform a first verify operation employing the first verify voltage PV and a second verify operation employing the second verify voltage PV_INT. The first verify operation is performed when the first and second data are programmed, and the second verify operation is performed only when the first data is programmed.

The first latch unit 222 is connected to the bit line select unit 221 through the sensing node SO and is configured to receive a first data, which will be programmed into a cell that is currently connected thereto, or store a second data to be programmed subsequently. The first latch unit 22 may include fifth to eleventh NMOS transistors N5 to N11 and first and second inverters IN1, IN2. The first and second inverters IN1, IN2 constitute a first latch L1 and may be connected between a node QA and a node QAb.

The fifth NMOS transistor N5 may be connected between the sensing node SO and the node QAb and my have a gate to which a control signal PDUMP is input. The control signal PDUMP may be input as a high level when data latched in the first latch L1 is transmitted to a second latch L2. The sixth and seventh NMOS transistors N6, N7 may be connected in series between the node QAb and the ground. The sixth NMOS transistor N6 may have a gate connected to the sensing node SO, and the seventh NMOS transistor N7 may have a gate to which a control signal CLCH is input. The eighth NMOS transistor N8 may be connected between the node QA and the ground, and may have a gate to which a control signal CEST is input. The control signal CEST may be input as a high level when the node QA of the first latch L1 is reset to a low level. The ninth and tenth NMOS transistors N9, N10 may be connected between the node QA and a node Y, and the node QAb and the node Y, respectively. The node Y may be connected to the Y decoder 230 (as shown in FIG. 2A) and may applied with external data. The ninth and tenth NMOS transistors N9, N10 may have gates to which a data input signal DI and an inverted signal nDI may be input, respectively. Data input from the Y decoder 230 may be latched in the first latch L1 in response to the data input signal DI or nDI. The eleventh NMOS transistor N11 may be connected between the sensing node SO and the node Y. The eleventh NMOS transistor N11 may have a gate to which a control signal CELLIV may be input.

The second latch unit 223 is connected to the sensing node SO and is configured to receive the first data from the first latch unit 222 and program the first data into a memory cell connected thereto, and a second verify determination unit 224 for determining whether a second verify operation using the second verify voltage PV_INT will be performed according to the state of the second data stored in the first latch unit 222.

The second latch unit 223 may include twelfth to seventeenth NMOS transistors N12 to N17, a second PMOS transistor P2, and third and fourth inverters IN3, IN4. The third and fourth inverters IN3, IN4 constitute the second latch L2, and may be connected between a node QBb and a node QB. The twelfth NMOS transistor N12 may be connected between the sensing node SO and the node QB, and may have a gate to which a control signal PGM is input. The control signal PGM is input as a high level when programming data, stored in the second latch L2, into a memory cell connected through the sensing node SO. The thirteenth NMOS transistor N13 may be connected between the node QB and the node Y, and may have a gate to which a control signal PBDO is input. The control signal PBDO is input as a high level when data stored in the second latch L2 is output through the node Y. The fourteenth NMOS transistor N14 may be connected between the node QB and the ground, and may have a gate to which a control signal MRST is input. The control signal MRST is input as a high level when resetting the node QB of the second latch L2 to a low level.

The fifteenth to seventeenth NMOS transistors N15 to N17 may be connected in series between the node QBb and the ground. The fifteenth NMOS transistor N15 may have a gate connected to the sensing node SO. The sixteenth NMOS transistor N16 may have a gate to which an output signal of the second verify determination unit 224 is input. When the output signal of the second verify determination unit 224 becomes a high level, the second verify operation employing the second verify voltage PV_INT is performed. However, when the output signal of the second verify determination unit 224 becomes a low level, the sixteenth NMOS transistor N16 may be turned off although the second verify voltage for the second verify operation is applied to the word lines. Thus, the second verify operation is not performed.

The seventeenth NMOS transistor N17 may have a gate to which a control signal MLCH is input. The second PMOS transistor P2 outputs a power supply voltage as a verify signal nWDO depending on a logic level state of the node QB. When the verify signal nWDO is output as a high level, it is meant that program is incomplete. After program is completed, the verify signal nWDO is not output.

The second verify determination unit 224 may include a NAND gate NA. The NAND gate NA may include two input terminals. One of the two input terminals may be applied with a control signal INT for the second verify operation and the other of the two input terminal may be connected to the node QAb of the first latch unit 222.

The second verify determination unit 224 may perform a NAND operation on the control signal INT and a logic level of the node QAb, and outputs the operation results. Logic levels of signals output according to the NAND combination are as follows.

TABLE 1

| INT | QAb | Output Signal |
|-----|-----|---------------|
| H | H | L |
| H | L | H |
| L | H | H |
| L | L | H |

As shown in Table 1, when both the control signal INT and the node QAb are in a high level, the output signal becomes a low level. At this time, the control signal INT is applied as a high level when the second verify operation is performed. In other words, the control signal INT becomes a low level while the first verify operation is performed in the program verify operation of the first data, and becomes as a high level while the second verify operation is performed. The control signal INT keeps a low level during program verification of the second data. This is because the second verify operation is not performed when programming the second data.

As described above, a voltage supply level when verification employing the first verify voltage PV and the second verify voltage PV_INT at the time of program operation is performed is described below.

Figure 3A:
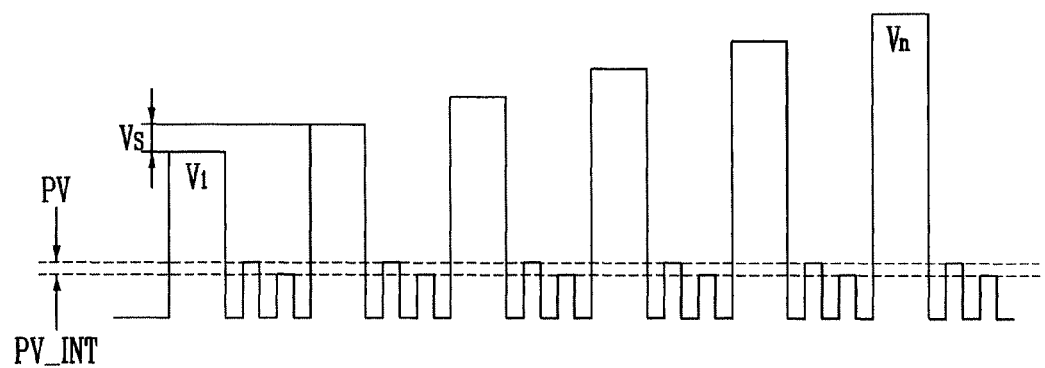
FIG. 3A illustrates ISPP voltage supply levels according to an embodiment of the present invention.

FIG. 3A illustrates ISPP voltage supply levels according to an embodiment of the invention. A program is performed using a program voltage V1 at the time of an initial program start. A first verify voltage PV and a second verify voltage PV_INT are provided. The ISPP voltage supply levels indicate only levels of voltage input to word lines selected for program irrespective of an operation of the page buffer circuit.

Figure 3B:
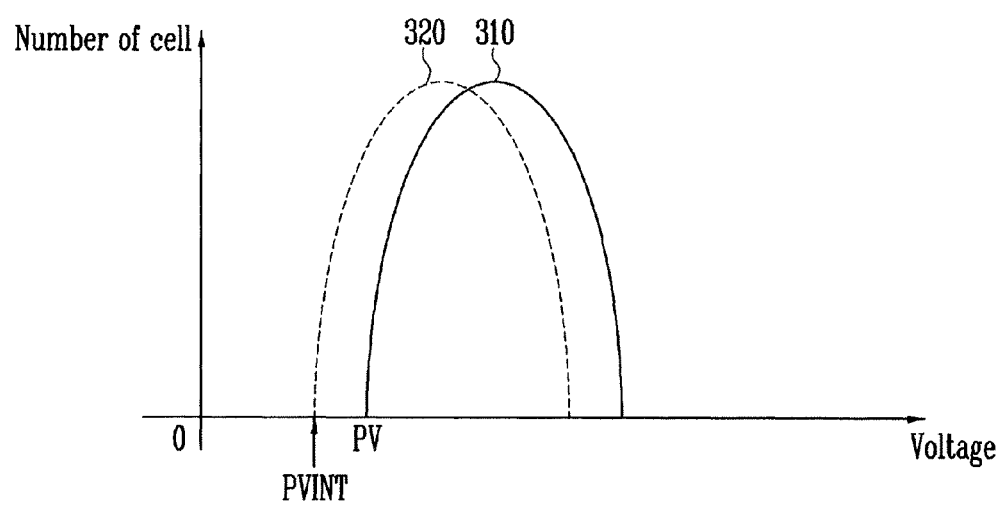
FIG. 3B illustrates a change of threshold voltage distributions depending on a program cell according to an embodiment of the present invention.

FIG. 3B illustrates a change of threshold voltage distributions depending on a program cell according to an embodiment of the invention. Threshold voltage distributions 310 of a cell on which program verification employing the first verify voltage PV may be performed, and threshold voltage distributions 320 of a cell on which program verification employing the second verify voltage PV_INT may be performed. Cells included in the threshold voltage distributions 320 of the cell on which program verification employing the second verify voltage PV_INT may be performed are cells having data to be programmed into a next cell. The term "next cell" refers to a cell to be programmed after program of a cell selected for a current program is completed. A program operation is described below with reference to the page buffer circuit PB of FIG. 2C according to an embodiment of the invention.

Figure 4A:
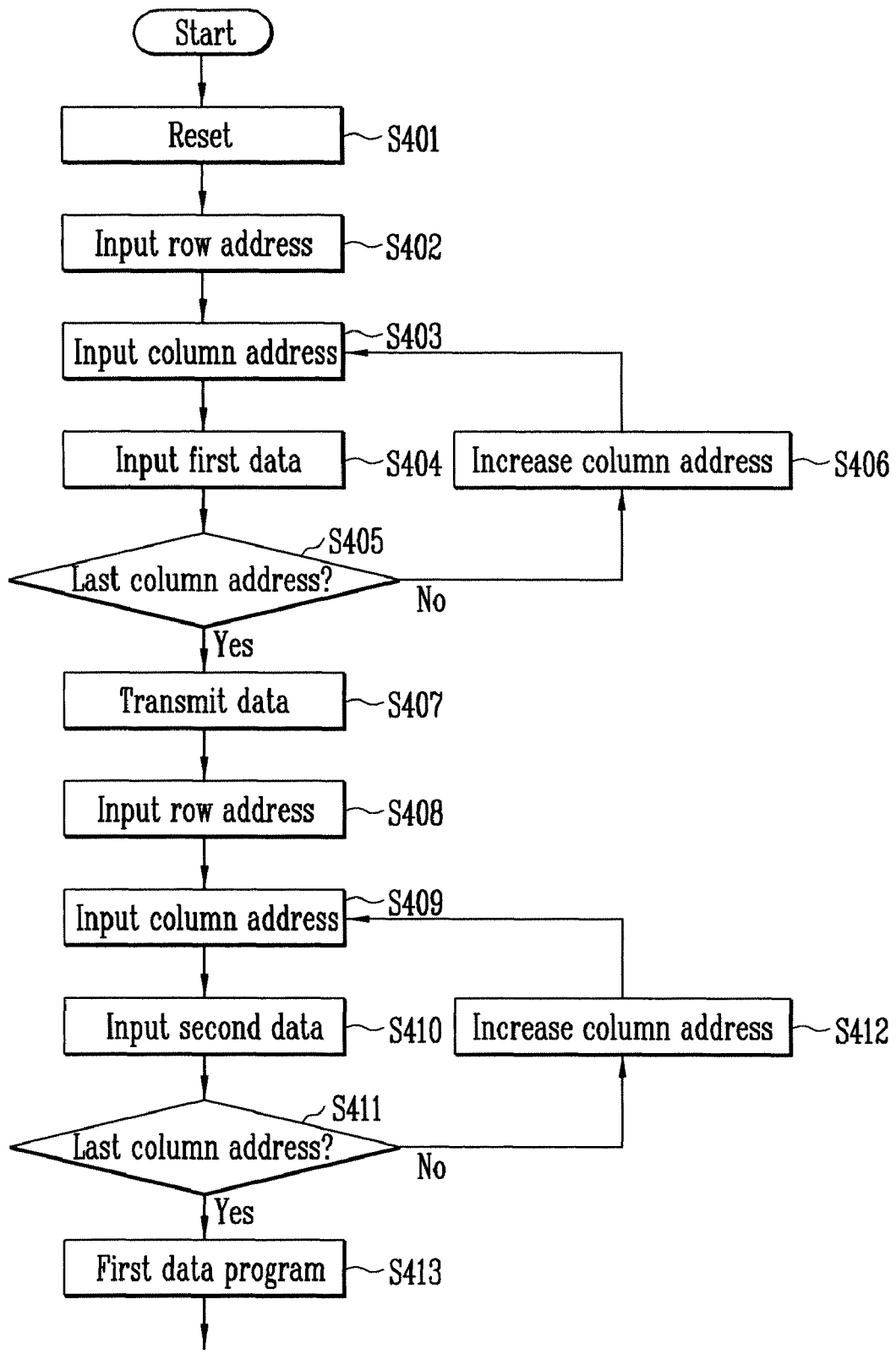
FIG. 4A is a flowchart illustrating a data input method for program according to an embodiment of the present invention.

FIG. 4A is a flowchart illustrating a data input method for program according to an embodiment of the invention. Before storing to-be-programmed data in the page buffer circuit, the control signals CEST and MRST may input as a high level, thus resetting the node QA of the first latch L1 and the node QB of the second latch L2 to a low level (S401). If the control signals CEST and MRST are input as a high level, the eighth and fourteenth NMOS transistors N8, N14 may turned on. Thus, the node QA and the node QB are connected to the ground and become a low level. Thereafter, a row address of a memory cell on which program will be performed is input (S402) and a column address of a memory cell on which program will be performed is then input (S403). The row address may include a word address.

First data to be programmed into a memory cell selected by steps S402 and S403 is input (S404). As shown in FIG. 2B, in order to latch data in the page buffer circuits PB, respectively, which may be connected to the first to N column lines COL<1> to COL<N>, the first data is input while increasing the column address. At this time, the first data may indicate data, which will be programmed first and is stored in the entire page buffer circuits PB of the page buffer unit 220 as mentioned above. This is because when the flash memory device performs program, the device performs program on a page basis, which may comprise of memory cells connected to each page buffer circuit PB of the page buffer unit 220. A method of latching the first data in the page buffer circuit PB is described below.

Data to be input may be connected through the node Y. In general, the node Y is connected to the ground. The first data is input to the first latch L1 in response to the control signal DI or nDI. In the first latch L1, data to be programmed is input to the node QAb. Thus, when the data to be input is '1', the control signal DI is input as a high level and, therefore, the node QA becomes a low level in order to make the node QAb a high level. Further, when the data to be input is '0', the control signal nDI is input as a high level and, therefore, the node QAb becomes a low level in order to make the node QAb a low level.

After the first data is all input to the first latch L1, the input first data is transmitted to the second latch L2 (S407). In order to transmit the data, the control signal PDUMP is input as a high level, the control signal INT is input as a low level, and the control signal MLCH is input as a high level.

The fifth and seventeenth NMOS transistors N5, N17 may turn on in response to the control signal PDUMP and the control signal MLCH. Further, if the control signal INT is input as a low level, an output signal of the second verify determination unit 224 is kept to a high level and therefore the sixteenth NMOS transistor N16 is also turned on. This is because an output signal of the NAND gate NA is in a high level when any one of input signals is in a low level. This is illustrated in Table 1.

In the state where the fifth, sixteenth and seventeenth NMOS transistors N5, N16, and N17 are turned on as described above, the fifteenth NMOS transistor N15 may turned on or off according to the state of the node QAb. At this time, the node QBb may reset by step S401 and is thus in a high level. When the node QAb is in a low level, the fifteenth NMOS transistor N15 may turn off. If the fifteenth NMOS transistor N15 is turned off, the node QBb may keep at a high level. On the other hand, when the node QAb is in a high level, the fifteenth NMOS transistor N15 may turn on. If the fifteenth NMOS transistor N15 is turned on, the node QBb may connected to the ground node and is thus changed to a low level, and the node QB is changed to a high level.

As described above, after the data of the node QAb of the first latch L1 is changed to the node QB of the second latch L2, second data to be programmed next is latched.

Regarding the second data, after the row address input in step S402 is input (S408) and the column address is input (S409), the second data may input to the first latch L1 (S410). The second data may then sequentially input to the first latches L1 of the entire page buffers PB while increasing the column address (S411, S412). The process of inputting the second data to the first latch L1 is the same as that described in step S404. If the first data is input to the second latch L2 and the second data is input to the first latch L1 as described above, the first data of the second latch L2 is programmed (S413).

The program process, after the first and second data are input to the page buffer circuit PB by steps S401 to S412, is described below.

Figure 4B:
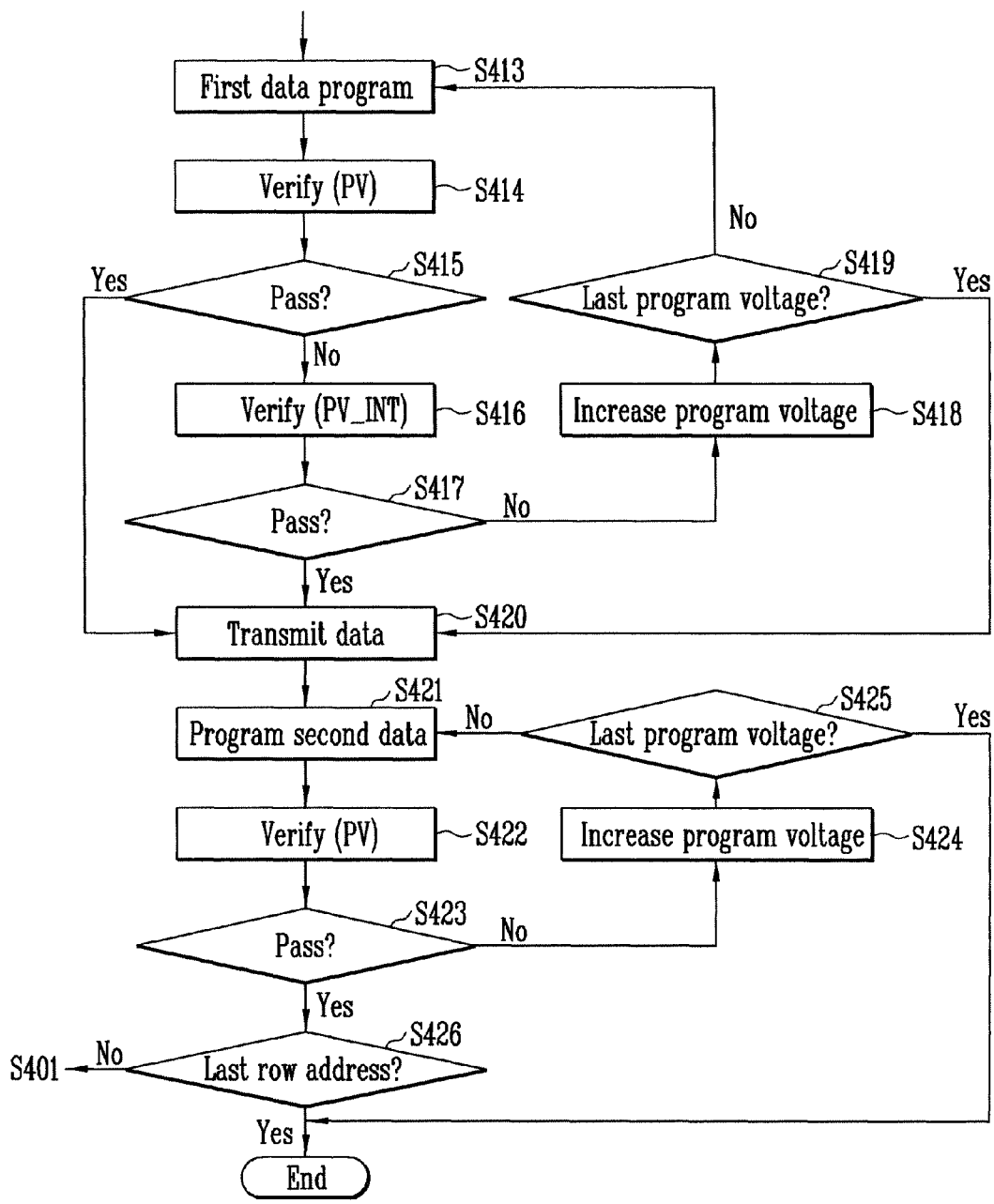
FIG. 4B is a flowchart illustrating a program method of data input according to the method of FIG. 4A.

FIG. 4B is a flowchart illustrating a program method of data input according to the method of FIG. 4A. The program method describes below begins at step S413 for programming the first data subsequently to step S412 of FIG. 4A. When programming the first data, the ISPP voltage shown in FIG. 3A may apply to the word line.

The first data input to the node QB of the second latch L2 may be programmed in the state where the first program voltage V1 is applied to the word lines (S413). When the data input to the node QB is in a low level, program is performed, but when the data input to the node QB is in a high level, program is not performed. For the purpose of the program, the control signal PGM is applied as a high level and, therefore, the twelfth NMOS transistor N12 is turned on. The program process may be the same as that of a general flash memory device and detailed description thereof is omitted.

After the program operation is performed, the first verify operation employing the first verify voltage PV is first performed (S414). While the first verify operation is performed, the control signal INT is input as a low level and the second verify determination unit 224 applies its output signal of a high level to the gate of the sixteenth NMOS transistor N16 in response to the control signal INT. Accordingly, the sixteenth NMOS transistor N16 keeps turned on while the first verify operation is performed.

Further, when the first verify operation is performed, if the precharge control signal PRECHb is input as a low level and therefore the first PMOS transistor P1 is turned on, the sensing node SO is precharged to a high level. The first verify voltage PV is then input to word lines, and bit lines on which the program operation has been performed are connected by the bit line select unit 221. After the memory cell 211 has been programmed, it is turned off by the first verify voltage PV. Accordingly, the voltage of a high level, which has been precharged with the sensing node SO, remains intact. When the sensing node SO is in a high level, the fifteenth NMOS transistor N15 is turned on.

Thereafter, if the control signal MLCH is input as a high level, the seventeenth NMOS transistor N17 may turn on and the node QBb may be connected to the ground node. When the program began, the node QBb may be kept a high level. However, after the program operation is finished, the node QBb may be connected to the ground node and thus changed to a low level, so the node QB is changed to a high level. If the node QB is changed to a high level, the second PMOS transistor P2 is turned off. Accordingly, the verify signal nWDO is not output, so that it can be seen that the program has been completed.

It is then determined whether the first verify operation has passed (S415). If, as a result of the determination in step S415, program has been completed (passed) by the first verify operation, the program operation of the first data is completed. However, if, as a result of the determination in step S415, the program has not passed, the sensing node SO is changed to a low level and therefore the fifteenth NMOS transistor N15 is turned off, so the state of the second latch L2 is not changed.

Meanwhile, if the program has not passed as a result of the first verify operation, the second verify operation is performed (S416). At this time, the control signal INT is input as a high level. Thus, the level of an output signal of the second verify determination unit 224 may change according to the state of the node QAb. When the node QAb is in a low level, the second verify determination unit 224 inputs its output signal of a high level to the gate of the sixteenth NMOS transistor N16. However, when the node QAb is in a high level, the second verify determination unit 224 inputs its output signal of a low level to the gate of the sixteenth NMOS transistor N16.

Therefore, when the node QAb is in a low level, the sixteenth NMOS transistor N16 is turned on, and when the node QAb is in a high level, the sixteenth NMOS transistor N16 is turned off. At this time, what the node QAb is in a low level is meant that the second data is data to be programmed, and what the node QAb is in a high level is meant that the second data is data not to be programmed. Thus, only when data must be programmed into a memory cell which will be programmed next, of memory cells that should be programmed currently, the second verify operation can be performed.

In order to perform the second verify operation, the word lines are applied with the second verify voltage PV_INT. At this time, the second verify voltage PV_INT is lower than the first verify voltage PV, and has voltage that has been lowered as low as a threshold voltage moved by the interference phenomenon when neighboring memory cells are programmed. In other words, if the threshold voltage of 0.5V has moved when programming neighboring memory cells, the second verify voltage PV_INT may be set to a voltage, which is 0.5V or more lower than the first verify voltage PV.

After the word lines are applied with the second verify voltage PV_INT, the sensing node SO is precharged and the sensing node SO and the bit lines are connected as described in the first verify operation.

Furthermore, as mentioned earlier, the control signal INT is input as a high level. If the node QAb is in a low level, a next cell may have to be programmed.

Therefore, the second verify determination unit 224 inputs its output signal of a high level to the sixteenth NMOS transistor N16 according to the control signal INT and the state of the node QAb. Accordingly, the sixteenth NMOS transistor N16 is turned on. If the second verify operation employing the second verify voltage PV_INT has passed, the sensing node SO becomes a high level and, therefore, the fifteenth NMOS transistor N15 is turned on. Thereafter, if the control signal MLCH is input as a high level, the seventeenth NMOS transistor N17 is also turned on.

The node QBb may be connected to the ground node and thus changed to a low level, and the node QB becomes a high level. Accordingly, verification is performed by the second verify voltage PV_INT.

Further, when the node QAb is in a high level, it is meant that a next memory cell has not been programmed. The first data may be programmed according to the first verify voltage PV instead of the second verify voltage PV_INT.

Consequently, when the node QAb is in a high level, the second verify determination unit 224 inputs its output signal of a low level to the sixteenth NMOS transistor N16, and turns off the sixteenth NMOS transistor N16.

If the sixteenth NMOS transistor N16 is turned off, the state is not changed because the node QBb becomes a floating state irrespective of whether the fifteenth NMOS transistor N15 is turned on or off by the sensing node SO. In other word, the verification employing the second verify voltage PV_INT is not performed.

It is then determined whether the second verify operation has passed (S417). If, as a result of the determination in step S417, the second verify operation has passed, the program operation of the first data is completed. However, if both the first verify operation and the second verify operation have not passed, the program voltage is raised as high as the ISPP step voltage Vs in the first program voltage V1 (S418). If the voltage increased in step S418 is the last program voltage Vn (S419), the program process of the first data may be treated as fail and the process then proceeds to the program process of the second data.

In order to program the second data, the second data stored in the first latch L1 is first sent to the first latch L1 (S420). This transmission process is the same as that of step S407 described in FIG. 4A and description thereof is therefore omitted. After the data of the second latch L2 is transmitted to the first latch L1, the second data is programmed (S421). When programming the second data, a program voltage is provided at the beginning of the initial voltage V1 and is set for program.

At this time, only the first verify operation employing the first verify voltage PV is performed (S422). When the first verify operation is performed, the control signal INT is input as a low level. It is then determined whether the first verify operation has passed (S423). If, as a result of the determination in step S423, the first verify operation has not passed, the program voltage is raised as high as the ISPP step Vs (S424) and program is performed again until the program voltage reaches the last program voltage Vn (S425) in order to determine whether the program has passed (S421 to S425).

If, as a result of the determination in step S423, the first verify operation has passed, it is determined whether a row address of a memory cell on which program has been performed is the last row address (S426). If, as a result of the determination in step S426, the row address is the last row address, the program operation is finished since there is no more memory cell on which the program operation must be performed. However, if, as a result of the determination in step S426, the row address is not the last row address, the row address is increased by one (step S401) and the program operation is then performed again.

The program operation described with reference to FIGS. 4A and 4B is a method considering only the interference influence in a X direction in the memory cell array 210 in order for a memory cell connected to even bit lines having the same row address and a memory cell connected to odd bit lines not to be interfered mutually, and a case considering interference in a Y direction by a row address has not been described.

However, in order to perform program in consideration of both the interference influence in the X direction and the interference influence in the Y direction, the second data is not programmed immediately after step S420 of FIG. 4B, but after a row address is changed and data to be programmed in the even bit lines is then stored in the first latch, both the first verify operation and the second verify operation may be performed in a similar way as steps S413 to S414 of FIG. 4B.

In other words, program is performed by consecutively latching data, which will be programmed into a memory cell now selected, and data, which will be programmed into a memory cell to be selected next, in the second latch and the first latch, respectively, according to an address scheduling sequence in which the memory cell 211 of the memory cell array 210 is selected, and verification is then performed using the first and second verify voltages. Accordingly, program can be performed without influence of interference in any direction. In this case, however, only the first verify operation is performed on data that will be programmed finally.

If program is performed as described above, in the event that data must be programmed into a memory cell that is selected next, a memory cell that is selected now is verified using the second verify voltage PV_INT and then programmed. Accordingly, when program is performed on a next memory cell, the memory cell can have the same threshold voltage distributions as those of a cell that is programmed using the first verify voltage PV due to the interference influence.

Although the foregoing description has been made with reference to the specific embodiments, it is to be understood that changes and modifications of the present invention may be made by the ordinary skilled in the art without departing from the spirit and scope of the present invention and appended claims.

What is claimed is:

1. A flash memory device comprising:
   a memory cell array;
   a page buffer unit including first and second latches and configured to program data into the memory cell array and read data from the memory cell array; and
   a switching element for enabling the first latch during a verify operation of a first program based on a first verify voltage, and enabling or disabling the first latch in order to execute a verify operation of a second program based on a second verify voltage lower than the first verify voltage depending on whether data to be programmed has been stored in the second latch.

2. The flash memory device of claim 1, wherein the second verify voltage is lower than the first verify voltage as low as a threshold voltage of a memory cell that is first programmed due to the second program.

3. The flash memory device of claim 1, wherein the switching element logically combines a second verify control signal and a second data stored in the first latch, and outputs a logical combination result as a second verify determination signal.

4. The flash memory device of claim 3, wherein the second verify determination signal enables verification employing the second verify voltage to be performed when the second data is program data.

5. The flash memory device of claim 1, wherein the first or second program is performed by first programming a memory cell that is first selected according to an input address and then programming a memory cell that is selected next.

6. A flash memory device comprising:
a memory cell array comprising a plurality of multi-level cells connected to a plurality of bit line pairs and a plurality of word lines, respectively;
a page buffer circuit unit comprising a plurality of page buffer circuits connected to the pairs of bit lines, respectively, and, respectively configured to temporarily store a first data for a first program and a second data for a second program and then program the first data according to a state of the second data;
a X decoder for selecting the word lines of the memory cell array according to an address input from an I/O controller; and
Y decoder circuits connected to the plurality of page buffer circuits, respectively, and a data I/O line and configured to transmit program data to the page buffer circuits or output read data, which are received from the page buffer circuits, to the data I/O line;
wherein each of the page buffer circuits comprises;
a page buffer unit including first and second latches and configured to program data into the memory cell array and read data from the memory cell array; and
a switching element for enabling the first latch during a verify operation of a first program based on a first verify voltage, and enabling or disabling the first latch in order to execute a verify operation of a second program based on a second verify voltage lower than the first verify voltage depending on whether data to be programmed has been stored in the second latch.

7. The flash memory device of claim 6, wherein the second verify voltage is lower than the first verify voltage as low as a threshold voltage of a memory cell that is first programmed due to the second program.

8. The flash memory device of claim 6, wherein the switching element logically combines a control signal and a second data stored in the first latch, and outputs a logical combination result as a second verify determination signal.

9. The flash memory device of claim 8, wherein the second verify determination signal enables verification employing the second verify voltage to be performed when the second data is program data.

10. The flash memory device of claim 6, wherein the first or second program is performed by first programming a memory cell that is first selected according to an input address and then programming a memory cell that is selected next.

11. A method of programming a flash memory device comprising a page buffer circuit connected to a pair of bit lines, the method comprising:
latching a first data that will be programmed into a first memory cell selected according to an address input to the page buffer circuit and a second data that will be programmed into a second memory cell to be programmed posterior to the first memory cell;
programming the first data into the first memory cell, and performing program verification employing a first verify voltage;
performing program verification of the first memory cell employing a second verify voltage according to a state of the second data and a control signal; and
after program of the first memory cell is completed, programming the second memory cell.

12. The method of claim 11, wherein the latching of the first and second data comprises:
latching the first data for program into the first memory cell selected according to an address input to a first latch of the page buffer circuit;
transmitting the first data latched in the first latch to a second latch of the page buffer circuit; and
latching the second data, which will be programmed into the second memory cell to be programmed posterior to the first memory cell, in the first latch.

13. The method of claim 11, wherein when the second data is a program data, program employing the second verify voltage is performed.

14. The method of claim 11, wherein the first verify voltage is higher than the second verify voltage.

15. The method of claim 14, wherein the second verify voltage is lower than the first verify voltage as low as a degree in which a threshold voltage of the first memory cell is changed due to the program of the second data.

16. The method of claim 14, wherein the programming of the second memory cell comprises:
transmitting the second data latched in the first latch to the second latch; and
secondarily programming data latched in the second latch into the second memory cell.

17. The method of claim 16, further comprising latching data to be programmed into the third memory cell in the first latch when there is a third memory cell that will be programmed subsequently to the second memory cell after the second data is transmitted to the second latch.

18. The method of claim 17, further comprising performing program verification employing the first verify voltage or the second verify voltage in the same manner as the program of the first memory cell when the third memory cell that will be programmed subsequently to the second memory cell exists after the second memory cell is programmed.

19. The method of claim 17, further comprising program verification employing the first verify voltage when the third memory cell that will be programmed subsequently to the second memory cell does not exists after the second memory cell is programmed.

20. The method of claim 11, wherein the first memory cell and the second memory cell are selected according to an input address.

* * * * *